(12) United States Patent
Oblinger et al.

(10) Patent No.: US 11,742,599 B2
(45) Date of Patent: Aug. 29, 2023

(54) COMPONENT FOR A VEHICLE ELECTRIC DRIVE, ASSEMBLY FOR A VEHICLE ELECTRIC DRIVE, AND METHOD OF ELECTRICALLY CONDUCTIVELY CONNECTING TWO COMPONENTS

(71) Applicants: Bayerische Motoren Werke Aktiengesellschaft, Munich (DE); Semikron Elektronik GmbH & Co. KG, Nuremberg (DE)

(72) Inventors: Wolfgang Oblinger, Ingolstadt (DE); Erick Maximiliano Haas Rugel, Munich (DE); Ingo Bogen, Nuremberg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 14 days.

(21) Appl. No.: 17/355,319

(22) Filed: Jun. 23, 2021

(65) Prior Publication Data
US 2021/0408698 A1    Dec. 30, 2021

(51) Int. Cl.
*H01R 4/02* (2006.01)
*H01R 43/02* (2006.01)
*H05K 7/20* (2006.01)

(52) U.S. Cl.
CPC ......... *H01R 4/029* (2013.01); *H01R 43/0221* (2013.01); *H05K 7/20509* (2013.01)

(58) Field of Classification Search
CPC ............... H05K 7/20509; H01R 43/0221
See application file for complete search history.

(56) References Cited

U.S. PATENT DOCUMENTS

| 6,919,529 B2 | 7/2005 | Franzen et al. |
| 10,090,774 B1 | 10/2018 | Beckedahl et al. |
| 2003/0114022 A1 | 6/2003 | Franzen et al. |
| 2007/0199926 A1* | 8/2007 | Watanabe ............ B23K 26/244 219/121.64 |
| 2021/0202372 A1* | 7/2021 | Kato ...................... H01L 25/18 |

FOREIGN PATENT DOCUMENTS

| DE | 100 36 900 A1 | 3/2002 | |
| DE | 10 2017 109 706 B3 | 3/2018 | |
| JP | 2019-237613 * | 1/2020 | ......... H01L 23/5222 |

* cited by examiner

*Primary Examiner* — Mukundbhai G Patel
(74) *Attorney, Agent, or Firm* — McNees Wallace & Nurick LLC

(57) ABSTRACT

A component for a vehicle electric drive is described, which includes at least one connecting lug pair projecting from the component for electrically connecting the component. Here, a first connecting lug and a second connecting lug of the connecting lug pair each have a joining zone for electrically connecting the component. Furthermore, an assembly for a vehicle electric drive is presented, which has at least two such components. Further presented is a method of electrically conductively connecting two components.

16 Claims, 6 Drawing Sheets

COMPONENT FOR A VEHICLE ELECTRIC DRIVE, ASSEMBLY FOR A VEHICLE ELECTRIC DRIVE, AND METHOD OF ELECTRICALLY CONDUCTIVELY CONNECTING TWO COMPONENTS

FIELD OF THE INVENTION

The invention relates to a component for a vehicle electric drive, having at least one connecting lug pair projecting from the component for electrically connecting the component.

The invention is further directed to an assembly for a vehicle electric drive having such a component.

In addition, the invention relates to a method of electrically conductively connecting two components, a first such component and a second such component being provided.

BACKGROUND

Components of this type, such as power electronics modules, electric driving machines or capacitor modules, assemblies comprising these components, and methods of electrically conductively connecting two such components are known from the prior art. Here, connecting lugs associated with each other are coupled to each other in an electrically conductive manner, for example by means of a clamping mechanism. For this purpose, known clamping mechanisms comprise a bolt and an abutment element. The connecting lugs to be coupled to each other are clamped between a bolt head of the bolt and the abutment element.

In this context, a connecting lug pair is understood to mean two connecting lugs associated with each other and, in particular, serving the same function. They constitute, for example, mutually associated positive and negative poles of a DC power connection or different phases of an AC power connection.

A connecting lug here is a flat conductor section that may also be formed by an end of a busbar.

The object of the invention is to improve known components, assemblies and methods to the effect that connecting lugs associated with each other can be connected in an electrically conductive manner quickly and reliably.

SUMMARY

The invention provides a component for a vehicle electric drive, having at least one connecting lug pair projecting from the component for electrically connecting the component, in which a first connecting lug and a second connecting lug of the connecting lug pair each include a joining zone for electrically connecting the component by means of a thermal joining seam. Thermal joining seams are comparatively quick and precise to produce here. This allows the component to be electrically connected within a short time. Moreover, thermal joining seams are long-lasting and robust in operation. The electrical connection is therefore extremely reliable. This is true in particular when the component is exposed to vibrations and/or temperature fluctuations. In addition, the joining zones permit a compact design of the electrical connection. Furthermore, the connecting lugs of a connecting lug pair can be positioned at a small distance from each other, resulting in a low-inductance connection. These effects and advantages are obtained in particular in comparison to an electrical connection by means of a clamping mechanism.

The component may, of course, also include two or more connecting lug pairs that are configured in the aforementioned manner.

The joining zone of the first connecting lug and the joining zone of the second connecting lug are preferably each arranged at the projecting end of the associated connecting lug.

The joining zones may be welding zones. In particular, the joining zones are laser welding zones.

In one variant, in an installed position of the component, the first connecting lug covers the second connecting lug of the connecting lug pair at least in sections. This means that in the installed position, the first connecting lug is located above the second connecting lug, at least in sections. A top view is decisive for this. This results in a space-saving arrangement of the connecting lug pair, while good accessibility for the electrical connection of the connecting lugs is maintained at the same time.

Here, in the installed position, the second connecting lug may be fully covered by the first connecting lug along an associated first horizontal direction and project beyond the first connecting lug along an associated second horizontal direction that is perpendicular to the first horizontal direction. Thus, the second connecting lug protrudes in relation to the first connecting lug only along one of the horizontal directions.

Preferably, an insulating layer is arranged between the first connecting lug and the second connecting lug. The insulating layer is to be understood here in the electrical sense and is designed in particular as an insulating sheet.

In one embodiment, the component is provided with a pressure element for pressing the first connecting lug and/or the second connecting lug against a base plate. Here, the base plate is in particular a cooling plate. Thus, the connecting lugs are reliably held against the base plate. In addition, they can be effectively cooled in this way. In the event that one single pressure element is used for pressing against both connecting lugs, it may be referred to as a shared pressure element.

For this purpose, the pressure element may comprise a pressure sleeve. This sleeve may include a stepped contact surface that rests against the first connecting lug by a first contact surface section and against the second connecting lug by a second contact surface section. In this way, connecting lugs which overlap at least in sections in their installed positions can be precisely and reliably pressed against the base plate.

The pressure sleeve may optionally be provided with a flange, which can be used to selectively influence the length of creepage distances, that is, the shortest distances between two conducting parts along a surface of an insulating material. In particular, this allows comparatively long creepage distances to be provided, resulting in safe operation of the component.

Also, the pressure element may include a bolt for pressing the first connecting lug and/or the second connecting lug against the base plate. The bolt can engage through the pressure sleeve and hold it permanently in contact with the connecting lugs.

The component may be a power electronics module, an electric driving machine, or a capacitor module. In this context, the connecting lug pair may be formed both as a DC power connection and as an AC power connection of the power electronics module. In particular, the power electronics module includes at least two connecting lug pairs, one being formed as a DC power connection and the other as an AC power connection. The power electronics module is then in particular an inverter module or a rectifier module. The capacitor module may more particularly be a DC link capacitor module. The latter is usually connected to a DC voltage connection of a power electronics module.

Moreover, the object is achieved by an assembly of the type initially mentioned, which includes a first component according to the invention, which is embodied as a power electronics module. Furthermore, the assembly includes a second component according to the invention, which is embodied as a capacitor module, and/or a third component according to the invention, which is embodied as an electric driving machine. Herein, at least one connecting lug of the power electronics module is electrically conductively connected to an associated connecting lug of the electric driving machine or to an associated connecting lug of the capacitor module by means of a thermal joining seam, in particular a weld seam. In this way, the power electronics module is electrically coupled to the electric driving machine and/or the capacitor module in a reliable manner. Here, the joining seams require only a comparatively small installation space.

In one alternative design, the connecting lug of the power electronics module is electrically conductively connected to the associated connecting lug of the electric driving machine or to the associated connecting lug of the capacitor module by means of a plate-shaped intermediate piece. Here, the intermediate piece is electrically conductively connected to the connecting lug provided on the power electronics module by means of a first thermal joining seam and is electrically conductively connected to the associated connecting lug of the electric driving machine or of the capacitor module by means of a second thermal joining seam. The intermediate piece serves in particular to ensure an accessibility necessary for the electrical connection of other connecting lugs. In addition, the intermediate piece may be used to bridge a distance between connecting lugs associated with one another.

Preferably, the thermal joining seam, the first thermal joining seam and/or the second thermal joining seam are laser weld seams.

The intermediate piece may have an opening that is configured for engagement therethrough by a pressure element.

Also, an insulating layer may be provided which electrically insulates the intermediate piece from connecting lugs that are not connected by means of the intermediate piece.

In addition, the object is achieved by a method of the kind initially mentioned, in which a first component according to the invention and a second component according to the invention are provided and a connecting lug of the first component is welded to an associated connecting lug of the second component. In particular, the connecting lugs are welded by means of a laser welding process.

In this context, a first end of an intermediate piece may also be welded to the connecting lug of the first component and an opposite, second end of the intermediate piece may be welded to the connecting lug of the second component. A laser welding process is preferably employed for this purpose as well.

Prior to welding one of the connecting lugs, an insulating layer may be placed under an associated joining zone. Alternatively or additionally, after welding of one of the connecting lugs, an insulating layer is placed onto an associated joining zone.

According to one embodiment, initially, one of the connecting lugs of a connecting lug pair of the first component is welded to an associated connecting lug of the second component.

Then the connecting lug and the associated connecting lug are covered with an insulating layer. Subsequently, another of the connecting lugs of the connecting lug pair of the first component is welded to an associated connecting lug of the second component. In particular, the second connecting lug of the connecting lug pair is welded to the associated connecting lug via an intermediate piece. The welding of the first connecting lug of the connecting lug pair is preferably effected without an intermediate element.

Besides, the effects and advantages discussed above for the component according to the invention and/or the assembly according to the invention apply in the same way to the method according to the invention, and vice versa.

DETAILED DESCRIPTION

Figure 1:
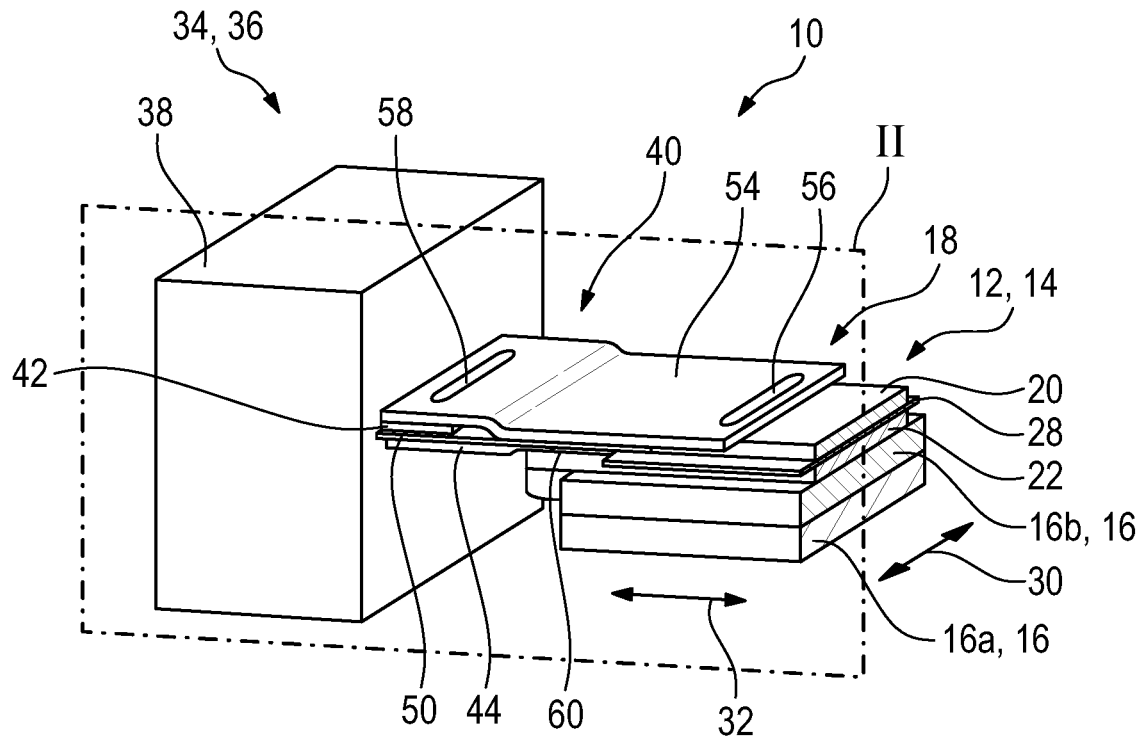
FIG. 1 shows an assembly according to a first embodiment of the invention, with two components according to the invention in a perspective view.
Figure 2:
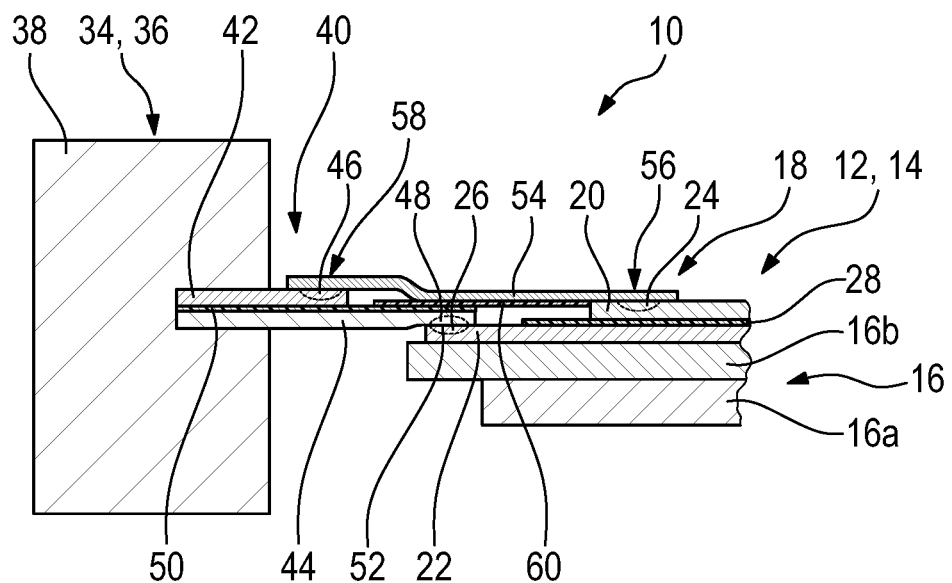
FIG. 2 shows the assembly from FIG. 1 in an illustration sectioned in plane II.

FIGS. 1 and 2 show an assembly 10 for a vehicle electric drive.

It comprises a first component 12 of the vehicle electric drive, which is in the form of a power electronics module 14.

In the embodiment shown, the power electronics module 14 is an inverter module of the vehicle electric drive.

The assembly 10 further includes a second component 34 of the vehicle electric drive, which is in the form of a capacitor module 36.

In the illustrated embodiment, the capacitor module 36 is an intermediate capacitor module of the vehicle electric drive that serves for voltage stabilization at the first component 12, that is, at the power electronics module 14. The first component 12 comprises a base plate 16 having a first base plate layer 16a and a second base plate layer 16b.

Furthermore, the first component 12 has a connecting lug pair 18 provided thereon for electrically connecting the first component 12.

It comprises a first connecting lug 20 and a second connecting lug 22.

Here, the first connecting lug 20 has a joining zone 24 provided thereon for electrically connecting the first component 12 by means of a joining seam.

The second connecting lug 22 also has a joining zone 26 arranged thereon for electrical connection of the first component 12 by means of a joining seam.

Both connecting lugs 20, 22 have their respective joining zone 24, 26 positioned at the projecting end thereof.

The joining zones 24, 26 are each positioned at the respective projecting end of the two connecting lugs 20, 22.

In the illustrated embodiment, both joining zones 24, 26 are laser welding zones.

An insulating layer 28 is positioned between the two connecting lugs 20, 22.

In the embodiment shown, it takes the form of an insulating sheet.

The connecting lugs 20, 22 are therefore not in contact with each other from an electrical point of view.

Furthermore, in an installation position of the first component 12, which corresponds to the representation in FIG. 1, the first connecting lug 20 overlaps a portion of the second connecting lug 22.

This overlap is configured such that the second connecting lug 22 is completely covered by the first connecting lug 20 along a first horizontal direction 30 (see FIG. 1). The second connecting lug 22 protrudes in relation to the first connecting lug 20 along a second horizontal direction 32, which is perpendicular to the first horizontal direction 30 (see also FIG. 3).

Owing to this structure, in particular the joining zone 26 of the second connecting lug 22 is not covered by the first connecting lug 20.

For reasons of greater clarity, those portions of the first component 12 that are located outside an area of the connecting lugs 20, 22 are not illustrated.

The second component 34 comprises a component body 38, from which a connecting lug pair 40 likewise protrudes, which serves to electrically connect the second component 34.

The connecting lug pair 40 comprises a first connecting lug 42 and a second connecting lug 44.

Both connecting lugs 42, 44 are each provided with a joining zone 46, 48, which allow the second component 34 to be electrically connected by means of a thermal joining seam.

Again, each of the joining zones 46, 48 is arranged at the projecting end of the associated connecting lug 42, 44.

In addition, the joining zones 46, 48 are formed as laser welding zones in the second component 34 as well.

Furthermore, the connecting lugs 42, 44 of the second component 34 are also arranged such that the first connecting lug 42 covers a portion of the second connecting lug 44.

This applies in the installation position of the second component 34, which corresponds to the illustration in FIG. 1.

In this case, the covering is configured such that the first connecting lug 42 completely covers the second connecting lug 44 along the first horizontal direction 30. Along the second horizontal direction 32, the second connecting lug 44 protrudes beyond the first connecting lug 42 (see also FIG. 3).

Because of this structure, the joining zone 48 of the second connecting lug 44 is not covered by the first connecting lug 42.

In addition, an insulating layer 50 is also positioned between the first connecting lug 42 and the second connecting lug 44 of the second component 34.

The insulating layer 50 is in the form of an insulating sheet.

For electrically connecting the first component 12, i.e. the power electronics module 14, to the second component 34, i.e. the capacitor module, the second connecting lug 22 of the first component 12 is electrically conductively connected to the second connecting lug 44 of the second component 34 by means of a thermal joining seam 52.

The thermal joining seam 52 here is a laser weld seam.

The first connecting lug 20 of the first component 12 is electrically conductively connected to the first connecting lug 42 of the second component 34 via a plate-shaped intermediate piece 54.

Here, the intermediate piece 54 is electrically conductively connected to the first connecting lug 20 of the first component 12 by a first thermal joining seam 56 and to the associated first connecting lug 42 of the second component 34 by a second thermal joining seam 58.

In addition, an insulating layer 60 is provided, which is arranged below the intermediate piece 54 in the installation position of the assembly 10.

The insulating layer 60 covers the joining zones 26, 48 at the same time.

It is used to electrically insulate the intermediate piece 54 from the connecting lugs 22, 44. The connecting lugs 22, 44 are not connected by means of the intermediate piece 54.

Figure 3:
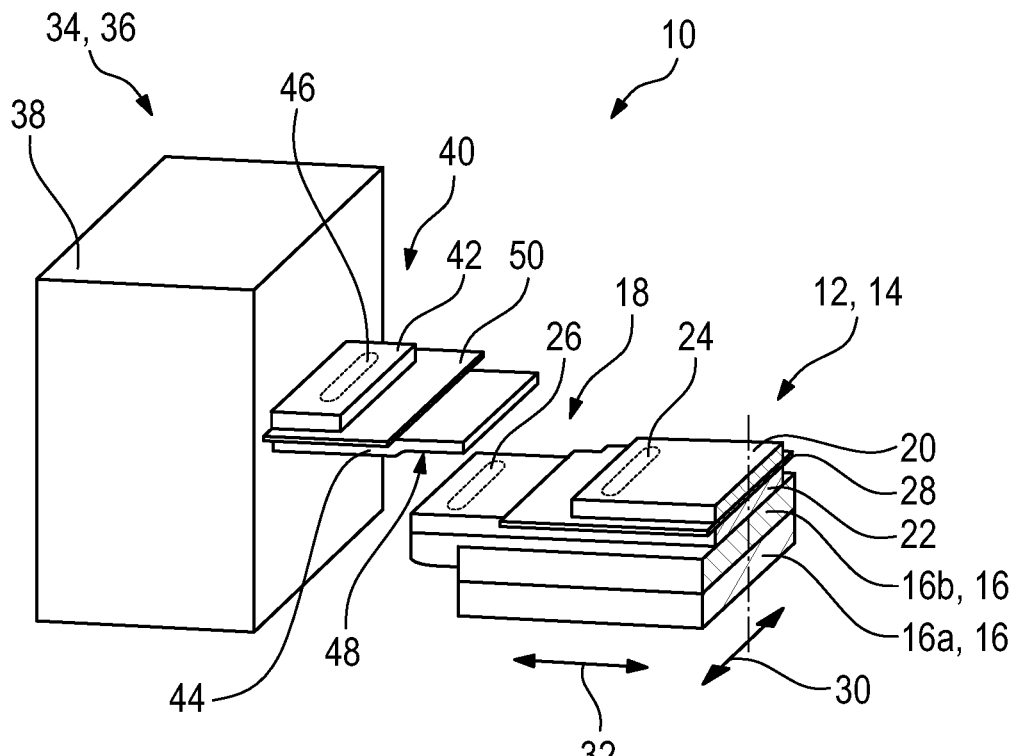
FIGS. 3 to 5 show steps of a sequence of a method according to the invention, with an assembly according to FIGS. 1 and 2 being produced by means of the method.
Figure 4:
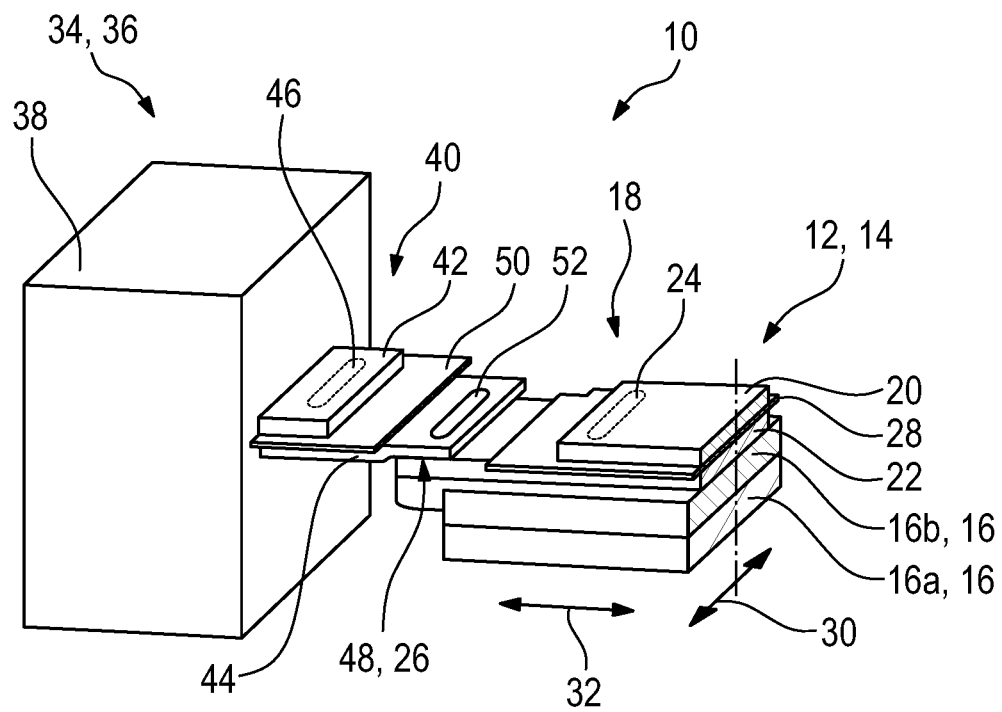
Figures 5, 6:
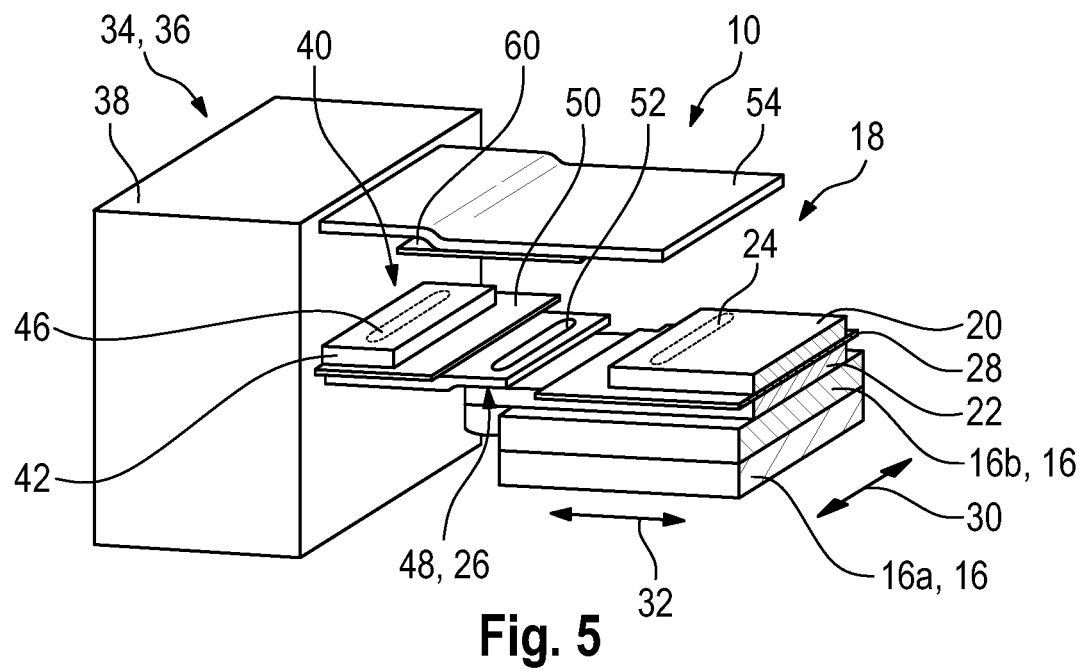
FIG. 6 shows a portion of an assembly according to a second embodiment of the invention, with two components according to the invention in a perspective view.

With reference to FIGS. 3 to 5, a method of electrically conductively connecting the two components 12, 34 will now be discussed below, by means of which the first component 12 and the second component 34 are electrically coupled to each other.

In the process, at first the first component 12 and the second component 34 are provided (see the Figure).

Thereafter, the second connecting lug 22 of the first component 12 is welded to the second connecting lug 44 of the second component 34 using a laser welding process. This produces the thermal joining seam 52 (see FIG. 4).

The second connecting lug 22 of the first component 12 and the second connecting lug 44 of the second component 34 are then electrically conductively connected.

Subsequently, the thermal joining seam 52 is covered with the insulating layer 60.

Moreover, the plate-shaped intermediate piece 54 is placed on the first connecting lug 20 of the first component 12 and the first connecting lug 42 of the second component 34 in such a way that the connecting lugs 20, 42 can be welded to each other via the intermediate piece 54 (see FIG. 5).

A laser welding process is used for this purpose.

Thus, the first joining seam 56 and the second joining seam 58 are formed.

As a result, the assembly 10 according to FIGS. 1 and 2 is obtained.

A second embodiment of an assembly 10 for a vehicle electric drive is shown in FIGS. 6 to 9.

Again, it comprises a first component 12 of the vehicle electric drive, which is configured as an electric power electronics module 14, and a second component 34 of the vehicle electric drive, which is configured as a capacitor module 36.

As in the first embodiment, the electric power electronics module 14 is an inverter module of the vehicle electric drive, and the capacitor module is a DC link capacitor module of the vehicle electric drive that serves to increase the voltage stability at the electric power electronics module 14.

With regard to the components 12, 34 and the assembly 10, only the differences from the first embodiment (see FIGS. 1 and 2) will be discussed below. Other than that, the above explanations are applicable to the second embodiment as well.

A first difference consists in that in the second embodiment, a total of two exemplary connecting lug pairs 18 are provided on the first component 12.

The same is true for the second component 34, which comprises two connecting lug pairs 40.

Since the two connecting lug pairs 18 and also the two connecting lug pairs 40 are each of the same construction, the following descriptions apply to both.

A second difference consists in that in the first component 12, each connecting lug pair 18 is provided with a pressure element 62 for pressing the first connecting lug 20 and the second connecting lug 22 against the base plate 16.

Figure 8:
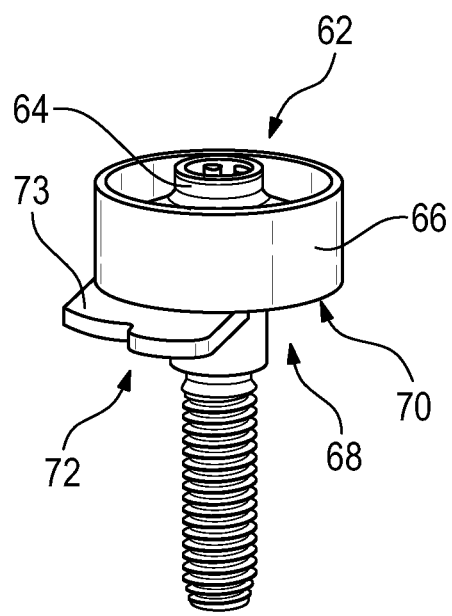
FIG. 8 shows a pressure element of a component according to the invention of an assembly according to FIGS. 6 and 7.
Figure 9:
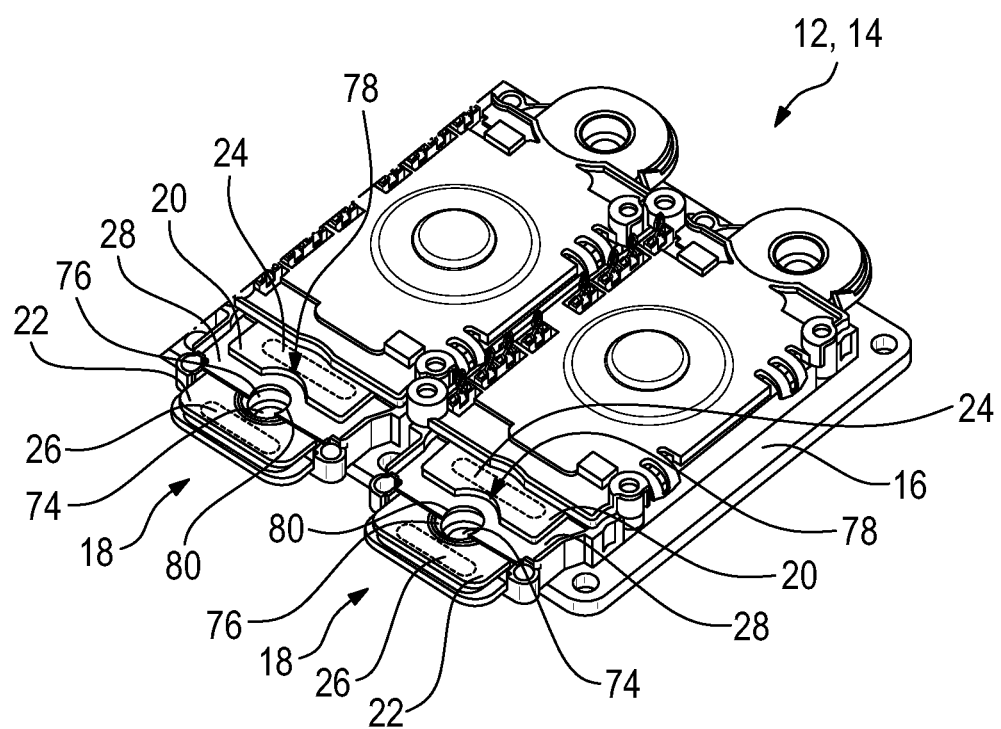
FIG. 9 shows a first component of the assembly of FIG. 6 in an isolated representation.

The pressure element 62 comprises a bolt 64 and a pressure sleeve 66 (see also FIG. 8).

The pressure sleeve 66 is provided with a contact surface 68, which has a stepped configuration.

Here, a first section 70 of the contact surface, a first step so to speak, is associated with the first connecting lug 20 and rests against it in the assembled state.

The pressure sleeve 66 further includes a flange 73, which serves to selectively influence creepage distances.

A second section 72, a second step so to speak, of the contact surface 68 is associated with the second connecting lug 22 and rests against it in the assembled state.

The bolt 64 is configured to hold the contact surface 68 in contact with the first connecting lug 20 and the second connecting lug 22. It is screwed into an associated thread 74 in the base plate 16 (see FIG. 9).

For this purpose, it engages through an opening 76 of the second connecting lug 22.

The first connecting lug 20 is provided with an indentation 78, so that the pressure sleeve 66 can be placed against the second connecting lug 22 by its contact surface 68.

The insulating layer 28 also has an indentation 80, which serves to keep free an access to the associated thread 74 for the bolt 64.

In the second embodiment, the base plate 16 is configured as a cooling plate.

As regards the design of the components 12, 34, reference will otherwise be made to the discussions relating to the first embodiment.

In the following, a method for electrically conductively connecting two components will be explained, by means of which the first component 12 and the second component 34 are electrically coupled to each other according to the second embodiment.

Herein, in a first step, the pressure elements 62 are mounted.

This means that the contact surface 68 is placed against the first connecting lug 20 and the second connecting lug 22, and the bolt 64 is screwed into the associated thread 74 on the base plate 16.

Figure 7:
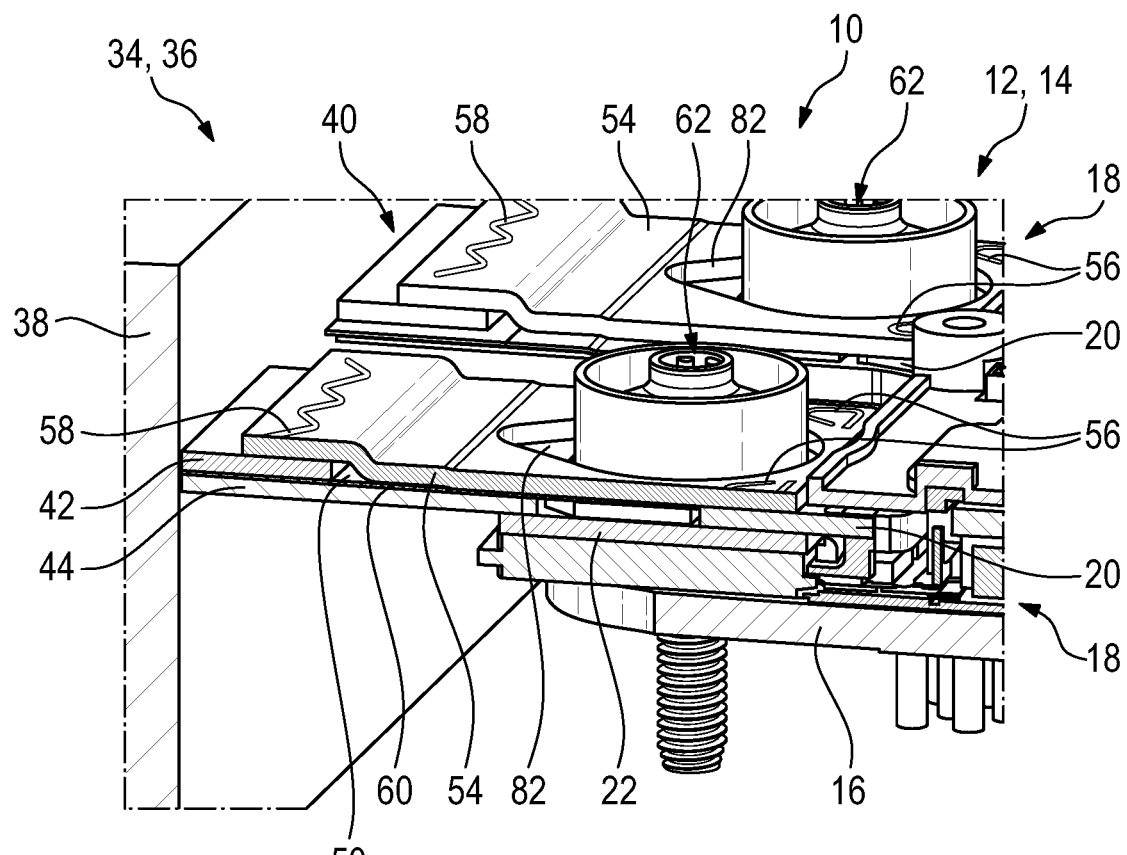
FIG. 7 shows the assembly from FIG. 6 in an illustration sectioned in plane VII.

In this way, the contact surface 68 is held in permanent contact with the associated connecting lugs 20, 22 (see FIGS. 6 to 8).

Starting from this, the method proceeds in the same way as in the first embodiment (cf. FIGS. 3 to 5).

That is, the second connecting lug 22 of the first component 12 is welded to the second connecting lug 44 of the second component 34 by means of a laser welding process.

This produces the thermal joining seam 52.

Subsequently, the thermal joining seam 52 is covered with the insulating layer 60.

The insulating layer 60 here comprises an indentation 61 through which the pressure sleeve 66 extends (see FIG. 6).

Then the plate-shaped intermediate piece 54 is placed on the first connecting lug 20 of the first component 12 and the first connecting lug 42 of the second component 34 so that the connecting lugs 20, 42 can be welded to each other via the intermediate piece 54.

Thus, the first joining seam 56 and the second joining seam 58 are formed.

In the second embodiment, the intermediate piece 54 is provided with an opening 82 which serves for the pressure element 62 to engage therethrough.

As a result, the assembly 10 according to FIG. 6 is obtained.

The assemblies 10 according to the two embodiments discussed above each comprise a second component 34, which is in the form of a capacitor module 36. It will be appreciated that, as an alternative or in addition to the second component 34, which in the present case is embodied as a capacitor module 36, a third component may be provided, which is in the form of an electric driving machine. The foregoing explanations are equally applicable hereto.

Figure 10:
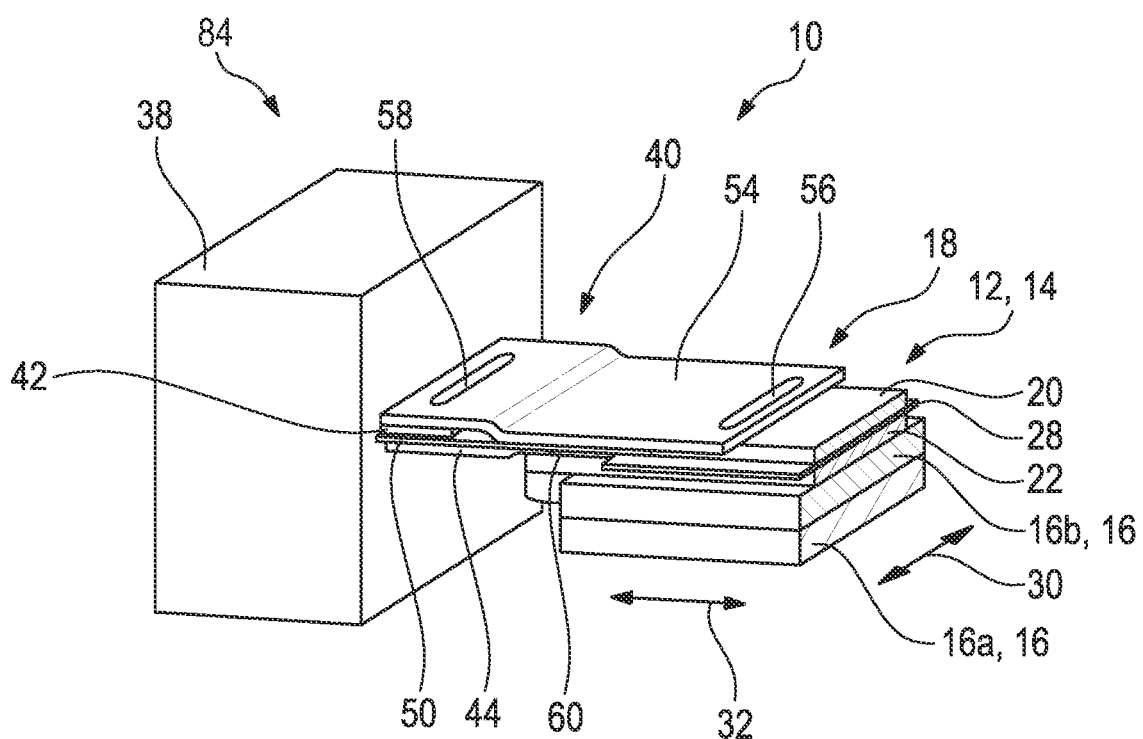
FIG. 10 shows an assembly according to another example embodiment, with components in a perspective view.

In the event that the first component 12 is electrically conductively connected both to a second component 34 and to a third component 84 (FIG. 10), the assemblies comprise at least two connecting lug pairs, one of the connecting lug pairs serving to electrically connect the second component 34 and the other connecting lug pair serving to electrically connect the third component 84.

The invention claimed is:

1. A component for a vehicle electric drive, comprising at least one connecting lug pair projecting from the component for electrically connecting the component, wherein a first connecting lug and a second connecting lug of the connecting lug pair each include a joining zone for electrically connecting the component via a thermal joining seam, wherein the component is provided with a pressure element for pressing at least one of the first connecting lug or the second connecting lug against a base plate, wherein the pressure element includes a pressure sleeve.

2. The component according to claim 1, wherein the joining zone of the first connecting lug and the joining zone of the second connecting lug are each arranged at the projecting end of the associated connecting lug.

3. The component according to claim 1, wherein the joining zones are welding zones.

4. The component according to claim 3, wherein the joining zones are laser welding zones.

5. The component according to claim 1, wherein, in an installed position of the component, the first connecting lug covers the second connecting lug of the connecting lug pair at least in sections.

6. The component according to claim 5, wherein, in the installed position, the second connecting lug is fully covered by the first connecting lug along an associated first horizontal direction and projects beyond the first connecting lug along an associated second horizontal direction that is perpendicular to the first horizontal direction.

7. The component according to claim 1, wherein an insulating layer is arranged between the first connecting lug and the second connecting lug.

8. The component according to claim 1, wherein the base plate is a cooling plate.

9. The component according to claim 1, wherein the component is at least one of a power electronics module, an electric driving machine or a capacitor module.

10. An assembly for a vehicle electric drive, comprising:
a first component including at least one connecting lug pair projecting from the component for electrically connecting the component, wherein a first connecting lug and a second connecting lug of the connecting lug pair each include a joining zone for electrically connecting the component via a thermal joining seam, which is embodied as a power electronics module;

a second component including at least one connecting lug pair projecting from the component for electrically connecting the component, wherein a first connecting lug and a second connecting lug of the connecting lug pair each include a joining zone for electrically connecting the component via a thermal joining seam, which is embodied as a capacitor module, and/or a third component including at least one connecting lug pair projecting from the component for electrically connecting the component, wherein a first connecting lug and a second connecting lug of the connecting lug pair each include a joining zone for electrically connecting the component via a thermal joining seam, which is embodied as an electric driving machine, wherein at least one connecting lug of the power electronics module is electrically conductively connected to an associated connecting lug of the electric driving machine or to an associated connecting lug of the capacitor module via a weld seam, and wherein the connecting lug of the power electronics module is electrically conductively connected to the associated connecting lug of the electric driving machine or to the associated connecting lug of the capacitor module via a plate-shaped stepped intermediate piece, wherein the intermediate piece is electrically conductively connected to the connecting lug provided on the power electronics module via a first thermal joining seam and is electrically conductively connected to the associated connecting lug of the electric driving machine or of the capacitor module via a second thermal joining seam.

11. The assembly according to claim 10, wherein the intermediate piece has an opening that is configured for engagement therethrough by a pressure element.

12. The assembly according to claim 10, wherein an insulating layer is provided which electrically insulates the intermediate piece from connecting lugs which are not connected via the intermediate piece.

13. A method of electrically conductively connecting two components, comprising the steps of:
 providing a first component including at least one connecting lug pair projecting from the component for electrically connecting the component, wherein a first connecting lug and a second connecting lug of the connecting lug pair each include a joining zone for electrically connecting the component via a thermal joining seam, and
 providing a second component including at least one connecting lug pair projecting from the component for electrically connecting the component, wherein a first connecting lug and a second connecting lug of the connecting lug pair each include a joining zone for electrically connecting the component via a thermal joining seam; and
 welding a connecting lug of the first component to an associated connecting lug of the second component,
 wherein initially, one of the connecting lugs of a connecting lug pair of the first component is welded to an associated connecting lug of the second component, then the connecting lug and the associated connecting lug are covered with an insulting layer, and subsequently another of the connecting lugs of the connecting lug pair of the first component is welded to an associated connecting lug of the second component, and
 wherein the another of the connecting lugs of the connecting lug pair of the first component is welded to an associated connecting lug of the second component via a plate-shaped stepped intermediate piece.

14. The method according to claim 13, wherein step b) is proved by laser welding.

15. The method according to claim 13, wherein prior to welding one of the connecting lugs, an insulating layer is placed under an associated joining zone, and/or after welding one of the connecting lugs, an insulating layer is placed onto an associated joining zone.

16. An assembly for a vehicle electric drive, comprising:
 a first component including at least one connecting lug pair projecting from the component for electrically connecting the component, wherein a first connecting lug and a second connecting lug of the connecting lug pair each include a joining zone for electrically connecting the component via a thermal joining seam, which is embodied as a power electronics module, wherein the first component is provided with a pressure element for pressing the first connecting lug and/or the second connecting lug against a base plate, the pressure element including a pressure sleeve;
 a second component including at least one connecting lug pair projecting from the component for electrically connecting the component, wherein a first connecting lug and a second connecting lug of the connecting lug pair each include a joining zone for electrically connecting the component via a thermal joining seam, which is embodied as a capacitor module; and/or
 a third component including at least one connecting lug pair projecting from the component for electrically connecting the component, wherein a first connecting lug and a second connecting lug of the connecting lug pair each include a joining zone for electrically connecting the component via a thermal joining seam, which is embodied as an electric driving machine,
 wherein at least one connecting lug of the power electronics module is electrically conductively connected to an associated connecting lug of the electric driving machine or to an associated connecting lug of the capacitor module via of a thermal joining seam.

* * * * *

UNITED STATES PATENT AND TRADEMARK OFFICE
CERTIFICATE OF CORRECTION

Page 1 of 1

PATENT NO. : 11,742,599 B2
APPLICATION NO. : 17/355319
DATED : August 29, 2023
INVENTOR(S) : Wolfgang Oblinger, Erik Maximiliano Haas Rugel and Ingo Bogen It is certified that error appears in the above-identified patent and that said Letters Patent is hereby corrected as shown below:

On the Title Page

Foreign Priority Information should read:
DE 102020116673.7
Filing Date: 2020-06-24

Signed and Sealed this
Fourteenth Day of November, 2023

Katherine Kelly Vidal
*Director of the United States Patent and Trademark Office*